United States Patent
Moffatt

(10) Patent No.: US 6,909,588 B2
(45) Date of Patent: Jun. 21, 2005

(54) SUBSTRATE HOLDER FOR RETAINING A SUBSTRATE WITHIN A PROCESSING CHAMBER

(75) Inventor: Stephen Moffatt, Jersey City, NJ (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/705,182

(22) Filed: Nov. 10, 2003

(65) Prior Publication Data

US 2004/0084633 A1 May 6, 2004

Related U.S. Application Data

(63) Continuation of application No. 10/049,755, filed as application No. PCT/US00/21377 on Aug. 4, 2000, now abandoned.
(60) Provisional application No. 60/147,684, filed on Aug. 6, 1999.

(51) Int. Cl.$^7$ ............................ H02N 13/00; A61N 5/00

(52) U.S. Cl. ..................................... 361/234; 250/492.2

(58) Field of Search .................. 250/492.2; 361/234; 364/525; 430/311; 118/5, 725

(56) References Cited

U.S. PATENT DOCUMENTS

| | | | |
|---|---|---|---|
| 4,480,284 A | 10/1984 | Tojo et al. | 361/234 |
| 4,665,463 A | 5/1987 | Ward et al. | 361/234 |
| 4,920,505 A | 4/1990 | Suzuki | 364/525 |
| 5,310,453 A | 5/1994 | Fukasawa et al. | 156/643 |
| 5,452,177 A * | 9/1995 | Frutiger | 361/234 |
| 5,581,324 A * | 12/1996 | Miyai et al. | 355/53 |
| 5,729,423 A | 3/1998 | Donde et al. | 361/234 |
| 5,883,778 A | 3/1999 | Sherstinsky et al. | 361/234 |

FOREIGN PATENT DOCUMENTS

| | | | | |
|---|---|---|---|---|
| EP | 0692814 | 1/1996 | | H01L/21/00 |
| EP | 0856862 | 8/1998 | | H01L/21/68 |

* cited by examiner

*Primary Examiner*—Nikita Wells
*Assistant Examiner*—Johnnie L. Smith, II
(74) *Attorney, Agent, or Firm*—Shirley L. Church

(57) ABSTRACT

A wafer chuck is designed to allow the substrate to thermally deform during charged particle beam lithography. The wafer chuck includes a compliant layer disposed over an chuck body. During lithography processing the wafer is electrostatically held in contact with a flexible compliant layer and the wafer is exposed to the charged particle beam resulting in thermal deformation of the wafer. The compliant layer deforms with the substrate and allows the wafer to deform in a predictable manner.

34 Claims, 3 Drawing Sheets

SUBSTRATE HOLDER FOR RETAINING A SUBSTRATE WITHIN A PROCESSING CHAMBER

This application is a continuation of application Ser. No. 10/049,755, filed Feb. 12, 2002, now abandoned, which claims priority under 35 USC § 119 to PCT application Ser. No. PCT/US00/21377, filed Aug. 4, 2000, which claims priority to U.S. Provisional Application Ser. No. 60/147,684, filed Aug. 6, 1999.

FIELD OF THE INVENTION

The present invention relates generally to wafer processing systems for semiconductor fabrication, and more specifically to a wafer holder for lithography systems, and other wafer processing steps.

BACKGROUND OF THE INVENTION

As the degree of circuit integration has increased, the feature sizes of IC's have dramatically decreased. To support future semiconductor fabrication requirements, lithography systems using charged particle beams, such as electron beams or ion beams, have been developed to overcome feature size limitations of traditional optical systems. In charged particle beam projection lithography systems, portions of a mask are exposed to a charged particle beam to project an image of the mask onto a substrate. Several new charged particle beam lithography systems have been developed to extend lithography capabilities to sub-0.15 micron feature size levels. One such system is a microcolumn electron beam system developed by IBM. This system uses a large number of miniature electron beam writers in a phased array to project mask images on the order of 0.1 micron wafer geometries. A similar electron beam projection lithography system is known as PREVAIL® also developed by IBM.

Another electron beam lithography system is a SCALPEL® developed by AT&T Bell Laboratories; SCALPEL, stands for "Scattering with Angular Limitation in Projection Electron-beam Lithography" and is a registered trademark of AT&T Bell Laboratories of Murray Hill, N.J. The SCALPEL lithography system exposes a photomask to high-energy electrons to project an image of the mask onto a substrate, coated with an energy sensitive material or resist. During semiconductor fabrication multiple layers are deposited on the substrate and several layers may be exposed to the patterned high-energy electrons.

Proper alignment of the mask image with preexisting features on the wafer during lithography processing is critical because many patterned layers must be aligned within specific tolerances to produce functional integrated circuits. The alignment tolerance or alignment budget of a projected pattern is proportional to the critical dimension (CD) of the circuit. A typically alignment tolerance or alignment budget is CD/3. During processing, the wafer is held on a chuck within the processing chamber typically by vacuum or electrostatic force. To ensure accurate positional registration, points on the wafer are interrogated or measured by the lithography tool alignment systems to automatically determine the locations of the preexisting features. This enables the next pattern level to be accurately positioned.

In conventional optical 248 nm, 193 nm wavelength UV, deep-UV, extreme-UV and electron beam lithography, energy density typically between about 10–25 $mJ/cm^2$ is applied to the wafer. If the energy applied to the wafer during conventional lithography processing is low and the wafer temperature rise is small (less than 0.1° C.), thermal expansion is small compared to the tolerances required at the feature sizes that can be printed with such tools. In lithography systems where the wafer temperature rise is less then 0.1° C., alignment correction due to thermal expansion is typically not required.

In wafer processing systems were thermal expansion needs to be controlled, thermalization of the wafer is a commonly used practice. Thermalization maintains a wafer at a constant temperature by passing constant temperature air over the surface during processing. Because thermalization requires the circulation of air, it is not compatible with vacuum chamber systems.

Some semiconductor and lithography processes, including SCALPEL, expose a smaller area of the wafers to substantially more energy which results in thermal distortion of the wafer. The exposure of the wafer to a high energy particle beam having an energy density of more than 1.0 $Joule/cm^2$ creates local heating at the area of incidence and can increase the local temperature from approximately 1° to 50° centigrade. As the particle beam traverses the wafer and energy is absorbed during lithography processing hot spots on the wafer are produced. These hot spots result in localized thermal expansion of the wafer. In lithography systems which project images with critical dimensions less than 0.15 $\mu m$, wafer temperature variations as low as 0.1° to 1° C. can produce enough thermal deformation to cause misalignment.

In lithography systems that expose the wafer to higher energy levels, the wafer temperature may be stabilized by control mechanisms which cool the wafer and reduce thermal expansion. Some wafer chucks have been designed to prevent wafer heating by circulating a fluid under the wafer to cool the wafer during processing. Wafer cooling chucks have been used primarily in systems which expose the entire wafer to plasma or ion beams during processing. Multiple zone wafer cooling chucks have also been developed which monitor the temperature of various areas of the wafer and independently adjust the cooling of each area to maintain the desired uniform water temperature. In general, however, multiple-zone wafer cooling chucks cannot prevent thermal deformation of wafers in high energy particle beam lithography systems because the energy absorbed by the wafer can not be removed quickly enough by conventional convection heat transfer mechanisms to prevent local heating of the wafer and thermal expansion. Also, because the high energy particle beam is quickly scanned across the substrate, the independent cooling zones of the present wafer cooling chucks may not be able to regulate a uniform temperature across the entire wafer to prevent thermal deformation.

The magnitude of thermal deformation of the substrate during lithography is proportional to the change in temperature of the substrate. Because particle beam lithography systems may only heat a small area and scan the wafer, the thermal deformation of the wafer varies throughout the lithography process and is not uniform. Thermal deformation due to heating during lithography processing can result in 10 to 100 nm of wafer movement.

As discussed, during lithography processing the substrate is generally held in contact with a chuck by a vacuum or electrostatic force. Because the wafer is held on a chuck by force, significant friction force can oppose any relative motion between the wafer and chuck including thermal deformation of the wafer. The friction force is dependent on the substrate material, the chuck material, the clamping force and the condition or roughness of the surfaces in contact.

During lithographic processing, the substrate is exposed to a high energy particle beam which produces a substantial amount of heat at the point of incidence. The thermal expansion force of the heated substrate is opposed by the friction forces between the substrate and chuck which prevents the wafer from expanding until the thermal expansion force exceeds the friction force. When the thermal expansion force exceeds the friction force the substrate quickly expands and is prevented from expanding again until the thermal expansion force again exceeds the friction force this type of affect is sometimes referred to as "stick-slip" motion. The relationship of the thermal expansion force and friction force causes the substrate to thermally deform in an incremental manner.

Similarly, as the substrate cools the thermal contraction force builds until the deformation force exceeds the friction force. Again, when the contraction force exceeds the friction force the substrate moves quickly and is prevented from contracting again until the thermal contraction force exceeds the friction force. Like the thermal expansion, the substrate contracts in an incremental manner. Stick-slip is a known problem in the fields of high energy lithography systems, monochromators and frequency stabilized lasers.

Stick-slip causes the thermal expansion of the substrate to be unpredictable and makes alignment of the substrate during processing extremely difficult. Alignment computer systems may be used to compensate for the thermal deformation of a substrate, however current alignment computer systems can not accurately determine the substrate position during thermal deformation having stick-slip motion.

SUMMARY OF THE INVENTION

The present invention relates to a wafer chuck which has a compliant layer interface in contact with the substrate that allows the wafer to thermally deform without stick-slip during lithographic processing. The compliant layer is in direct contact with the substrate and is sufficiently flexible to allow the substrate to deform without any relative movement between the substrate and compliant layer during lithography processing. Because the complaint layer deforms with the substrate during localized heating there is no relative movement between the substrate and compliant layer during lithography processing.

A microprocessor system utilizes the processing conditions and physical characteristics of the substrate to predict and measure the thermal deformation of the substrate throughout lithography processing. By predicting and measuring the thermal deformation of the substrate, the microprocessor can adjust the incident electron beams with charged particle beam deflectors to compensate for the wafer's thermal deformation. As a result of the microprocessor's compensation for thermal deformation, the projected images are accurately aligned during lithography processing.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE INVENTION

A system for securely holding a wafer during lithographic processing is described. In the following description, for purposes of explanation, numerous specific details are set forth in order to provide a thorough understanding of the present invention. It will be evident, however, to one of ordinary skill in the art, that the present invention may be practiced without these specific details. The description of preferred embodiments is not intended to limit the scope of the claims appended hereto.

During lithographic processing, charged particles or radiation are directed through a mask to project an image of portions of the mask onto a substrate, such as a silicon wafer having an energy sensitive or photo resist layer. Typical charged particle beam lithography systems use electron beam or ion beam projection systems to fabricate a wafer using an image mask. In one embodiment of the present invention, the wafer holding system is implemented in a SCALPEL (Scattering with Angular Limitation in Projection Electron-beam Lithography) system.

Figure 1:
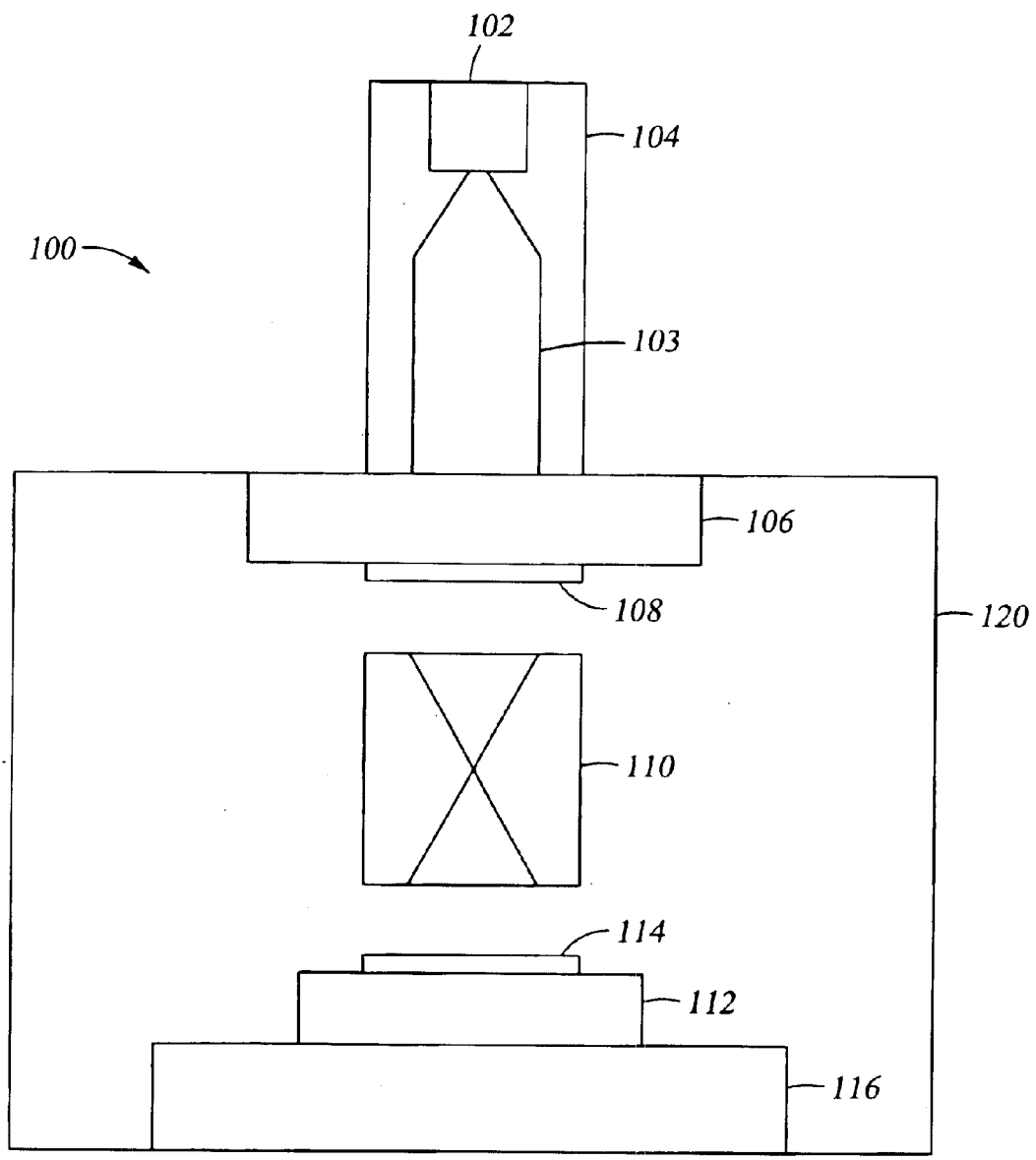
FIG. 1 is a cross sectional illustration of a charged particle beam lithography system.

As is well known, in a SCALPEL system, high-energy electrons are projected through a mask. Various types of masks are suitable for use with SCALPEL systems. A typical SCALPEL mask has two types of regions that scatter electrons more or less strongly. The electrons pass through the mask to project an image of the mask onto the substrate. The mask is essentially transparent to energized electrons (typically 100 keV) of the electron beam; however, the difference in electron scattering characteristics between the less strongly scattering and more strongly scattering regions, when differentiated by an aperture, provides sufficient contrast at the wafer plane for lithographic purposes. With reference to FIG. 1, system 110 represents the electron optical system of a SCALPEL lithography system that includes embodiments of the present invention. The mask stage 106, chuck 112 and imaging column 110 are enclosed within a process chamber 120. For a SCALPEL system, the process chamber 120 is generally maintained at a sub-atmospheric environment and thus may also be referred to as a vacuum chamber. The optical system includes an electron source 102, which is typically implemented as an electron gun. Electron source 102 projects electrons 103 through an illumination column in an illumination chamber 104 to mask stage 106. Mask stage 106 holds a mask 108 that includes strongly scattering regions and less strongly scattering regions. The electron beams pass through the mask 108 and an imaging (or projection) column 110 to form focused electron beams 105 that are projected onto a wafer 114 held by chuck 112. Imaging column 110 also includes a back-focal plane aperture that blocks strongly scattered electrons and allows less strongly scattered electrons to pass through to the wafer 114.

Figure 2A:
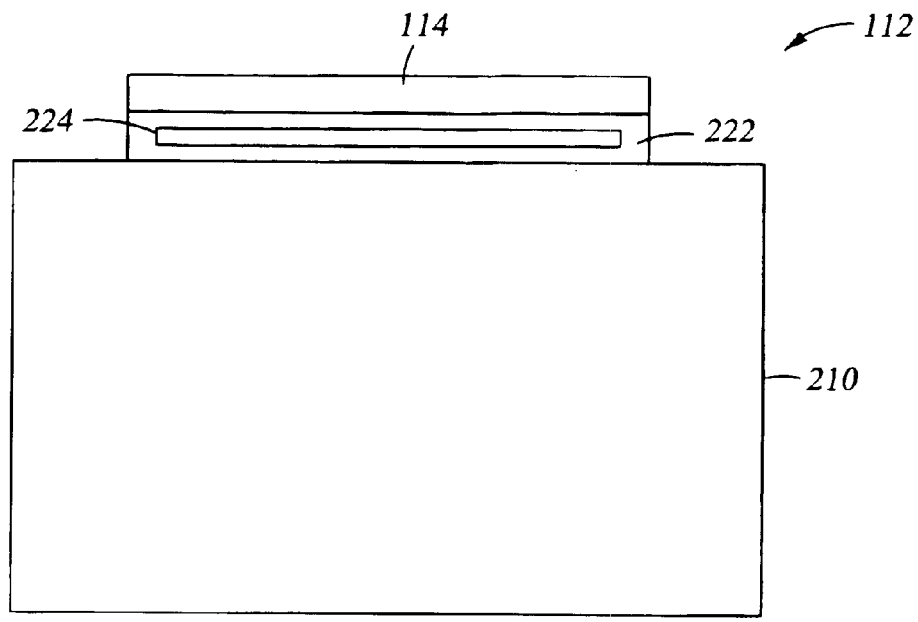
FIG. 2a is a cross sectional illustration of an embodiment of the inventive electrostatic chuck.
Figure 2B:
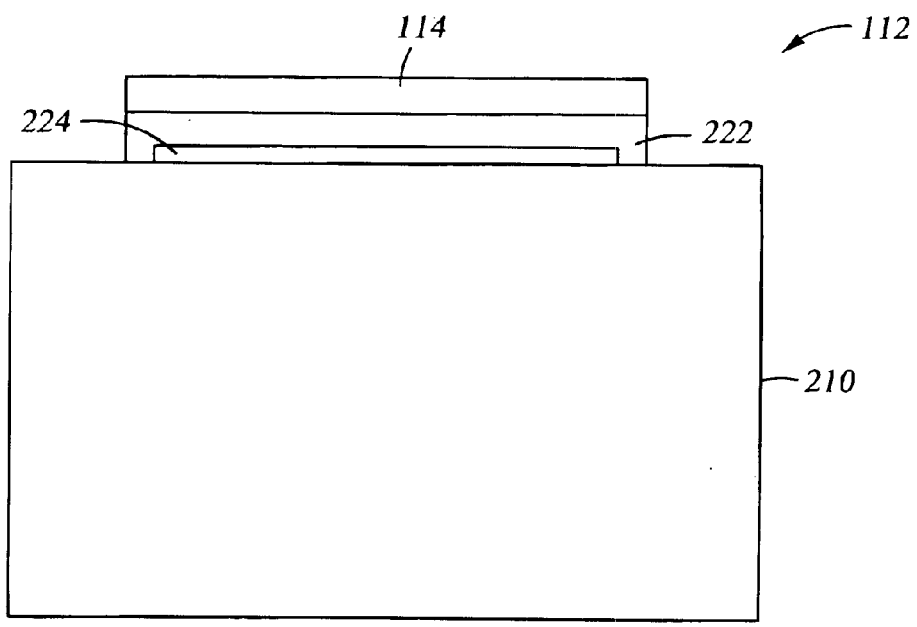
FIG. 2b is a cross sectional illustration of an alternate embodiment of the inventive electrostatic chuck.

With reference to FIG. 2a, an embodiment of the present invention is illustrated in more detail. Electrostatic chuck 112 comprises a pedestal 210 containing an electrode 224 and a compliant layer 222 which is in contact with the wafer 114 during lithography processing. With reference to FIG. 2b, an alternative embodiment of the present invention is illustrated. Electrostatic chuck 112 comprises a pedestal 210 and an overlying compliant layer 222 which is in contact with the wafer 114 during lithography processing.

The electrode 224 is made from any suitable electrically conductive material, some examples being, copper, nickel, chromium, aluminum, iron, and mixtures or alloys thereof. The electrode 124 may have a thickness from about 1 μm to 1,000 μm. The chuck 110 is typically configured to hold wafer 114 perpendicular to an imaging column 110 axis which projects patterned images onto the wafer 114. The chuck 112 exerts an attractive force which holds the wafer 114 onto the chuck 112.

In one embodiment of the present invention, the compliant layer 222 is made of a flexible polymer such as but not limited to fluorosilicones, polyamides, polyimides, polyketones, polyetherketones, polysulfones, polycarbonates, polystyrenes, polyurethanes, nylons, polyvinylchlorides, polypropylenes, polyetherketones, polyethersulfones, polyethylene terephthalate, fluoroethaylene propylene copolymers, cellulose, triacetates, silicones and rubbers. Other suitable compliant layer materials having low particulate and low metal content are also available.

The compliant layer may also include filler materials for increasing the thermal conductivity and/or resistance to corrosion or abrasion. Preferably, the filler materials is a powder with an average particle size significantly smaller than the thickness of the compliant layer. The particle size of the filler material is preferably less than about 1 μm. The filler is dispersed in the polymer film in a volumetric ratio from about 10% to 80%, and more typically from about 20% to 50%. Fillers such as diamond, alumina, zirconium boride, boron nitride and aluminum nitride are preferred because these materials have high thermal conductivity, good insulative properties and can withstand high temperatures.

The complaint layer may be formed on the chuck by spraying, molding, spinning or attaching in any other appropriate manner. The compliant layer may have a thickness from about 1 μm to 10 μm. The compliant layer also prevents the flow of electrons between the electrode and the wafer. Optimally, the shape and size of the compliant layer corresponds to the shape and size of the wafer to provide a good heat transfer path to cool the wafer during processing. Alternatively, the compliant layer may have a different shape and size than the wafer.

Multiple compliant layers having different characteristics may also be formed on the chuck. For example, to improve the life of the compliant layer, a harder material may be used on the exposed surfaces to improve abrasion resistance and an underlying elastic material may be used to maintain the flexible characteristics. In another example, the primer layer may be used between the electrode and the main compliant layer to improve the adhesion between the electrode and the main compliant layer.

In one embodiment of the present invention, the compliant layer should exhibit the following characteristics: a flexible surface (Shore hardness scale A between 25 and 75), good electric insulation, good dielectric properties (dielectric constant between 1.0 and 3.0), moderate thermal conductivity, sufficient elasticity, low outgassing in a vacuum, low lift-off force, low hysteresis to electrostatic chucking-dechucking and no shedding of particles during wafer processing.

Figure 3:
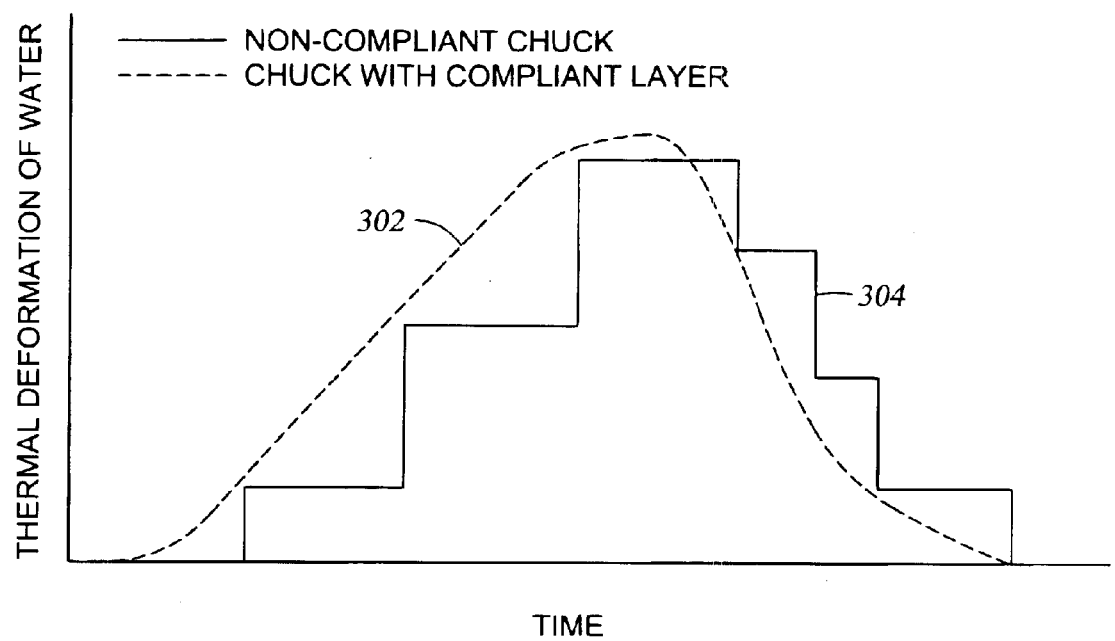
FIG. 3 is the thermal motion of the substrate versus time during lithographic processing.

As discussed previously, a problem associated with thermal expansion of wafers, is that wafers thermally deform in a stick-slip manner due to the friction force between the wafer and the chuck as illustrated in FIG. 3. The present invention eliminates the stick-slip problem by providing a flexible layer that deforms with the wafer during lithography processing. Specifically, because there is no relative movement between the wafer and the upper surface of the compliant layer, there are no friction forces opposing the thermal deformation forces of the wafer which produces stick-slip. By processing wafers on a chuck having a compliant layer the thermal deformation of the wafer is smooth. Although friction forces do not oppose the wafer's thermal deformation, the elasticity of the compliant layer may oppose the wafer expansion forces and assist the wafer contraction forces. The compliant layer acts like a two dimensional spring, stretching during wafer expansion and returning to its normal shape during wafer contraction.

Referring to FIG. 3, the solid line 304 represents the motion of the wafer during processing on a chuck that does not have a compliant layer. The horizontal sections represent the "stick" periods when the wafer is not moving. The vertical sections represent the "slip" periods when the wafer is sliding relative to the chuck.

The dashed line 302 represents the thermal deformation of a wafer mounted on the inventive chuck during charged particle beam lithography processing. The sideways movement of the wafer is smooth because there is no relative movement between the wafer and the upper surface of the compliant layer in contact with the wafer. The compliant layer deformation curve is effected by the elastic properties of the complaint layer. As discussed, the compliant layer acts as a two dimensional spring resisting wafer expansion and accelerating wafer contraction. The compliant layer deformation curve may change with use due to the hysteresis effect from repetitive deformation.

Because the thermal deformation characteristics of the chuck with compliant layer are predictable and repeatable, wafers mounted on the inventive chuck may be more accurately exposed to patterned charged particles or radiation. Specifically, because the thermal deformation of the wafer is free from stick-slip, the exact position of the wafer can be determined and the projected mask image can be adjusted to compensate for the thermal deformation of the wafer.

During processing the wafer is placed against two rigid edge reference points and may be held on the chuck with an attractive clamping force greater than 5 N. Because the wafer is in contact with the flexible compliant layer and the compliant layer deforms with the wafer, friction forces do not act upon the wafer during lithography processing. Because there is no sliding between the wafer and compliant layer, metal and polymer particles are not shed from the wafer or complaint layer and the chamber contamination is minimized. After processing the clamping force is removed and the lift off force required to separate the wafer from the inventive chuck may be less than 5 N. The compliant layer does not leave residue on the wafer when the wafer is removed from the chuck.

It is well known that the lift off force after processing can be very high when a smooth wafer surface is in contact with a smooth wafer chuck. In order to reduce this lift off force the exposed surface of a chuck is often roughened. Dimpling is one method of roughening the chuck surface and reducing the lift off force. Similarly fine grooves (1100 per cm) may be formed on the chuck surface to roughen the surface.

During lithography processing, the upper surface of the compliant layer expands with the wafer while the bottom surface remains fixed to the electrode resulting in sideways deformation and shear stress within the complaint layer. In one embodiment, the compliant layer is capable of shear deformation between 2% to 10% relative to the compliant layer thickness. During charged particle beam lithography the thermal deformation of the wafer is typically less than 0.1 μm. A 0.1 μm deformation of a 1.0 μm thick compliant layer produces 10% shear deformation. Preferably the compliant layer is between 1.0 and 3.0 μm thick, thus, the compliant layer should be capable of withstanding at least 10% shear stress without exceeding the yield strength of the compliant layer.

The wafer plane deformation of the compliant layer may result in contraction of the complaint layer thickness because the volume of the compliant layer may be constant. A sideways expansion in the range of 0.1 μm or less may result in a decrease of 1 to 20 nm in the compliant layer thickness. Because the wafer is mounted on the compliant layer, the distance between the wafer and the optical system changes. The projected mask image quality should not be affected by the small (1 to 20 nm) wafer movement which is well within the depth of focus of the optical system.

Because the thermal deformation is smooth and free from stick-slip, the expansion and contraction of the wafer mounted on the inventive chuck can be accurately determined for a given wafer temperature. Further, the wafer position can be predicted throughout lithography processing with the inventive chuck because the wafer temperature is carefully monitored and/or calculated during charged particle beam lithography processing.

In SCALPEL, or sub-field scanning lithography systems, if the exact position of the wafer during processing is known, deflection units can redirect the beam to compensate for movement of the wafer during processing. This compensatory charged particle beam deflection results in accurate positioning of the mask image on the wafer. Thus, it is critical for the lithography system to know the exact position of the wafer at all times during processing. The inventive chuck improves lithography processing because stick-slip is removed and the wafer position can be accurately determined during lithographic processing.

In an embodiment, a computer is programmed to predict the wafer position based upon a "look-forward predictive model". In the semiconductor manufacturing art, the fabrication processes are carefully controlled and accurately repeated during manufacturing. Because the wafers are processed in a carefully controlled repetitive manner each wafer will have identical thermal deformation. By knowing how wafers thermally deform during processing, the lithography system is configured to direct the charged particle beam to anticipate the thermal deformation of the wafer.

In another embodiment of the present invention, lithography processing includes on-wafer registration alignment. In SCALPEL lithography systems, on-wafer registration alignment is achieved by scanning the image of a mark on the mask over a corresponding mark on the wafer. A backscattered electron signal, which represents a convolution of the two marks, is then detected and analyzed. The lithography system computer analyzes the backscattered electron signal and automatically corrects detected errors in rotation, magnification and distortion. The lithography system computer determines the required system settings to correct the alignment error and corrects the control signals to the mask stage, wafer stage and imaging column.

In one embodiment of the present invention temperature sensors and/or temperature monitors determine the localized temperatures across the wafer during the lithography process. The localized wafer temperature information is forwarded to a computer which calculates the wafer position and controls the deflection units to redirecting charged particle beams to compensate for the thermal deformation of the wafer.

As discussed, the present invention allows the wafer to expand and contract without sliding between the wafer and the compliant layer. Because there is no sliding there is no particle generation. This ability to avoid particle generation is beneficial not only to lithography systems, but any other wafer processing apparatus that requires a high level of cleanliness. Thus the present invention is an improvement to any type of semiconductor processing system in which the wafer thermally deforms. These applications are not limited to wafer holders fixed within a processing chamber, for example wafers are typically transported between processing chambers with a robotic arm. Because wafers are often heated during processing, the wafer may thermal deform while being transported between processing chambers. By using a compliant layer with the wafer holder on a robotic arm would reduce particle generation within the semiconductor processing equipment.

Although specific embodiments of the present invention have been discussed in relation to a SCALPEL lithography system, it will be appreciated by those of ordinary skill in the art that embodiments of the present invention may also be used in other types of systems. Such systems may include: deposition, etch, passivation, thermal processing, robotic arm, micro-column electron beam systems, ion beam projection systems, and similar types of lithography systems. In these cases, the chuck with a compliant layer is used in the same manner described above in relation to the SCALPEL system.

In the foregoing, a wafer holding system for use with charged particle beam lithography system has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A wafer holder for retaining a substrate within a processing chamber comprising: an electrode; and one or more layers covering a portion of said wafer holder which contacts a wafer, where at least one of said layers is compliant, so that said portion of said wafer holder which contacts said wafer deforms with said wafer, avoiding relative movement between said wafer and said contacted portion of said wafer holder, when there is localized thermal deformation of said wafer surface during processing.

2. The wafer holder of claim 1 wherein said compliant layer is an electrical insulator having a dielectric constant between 1 and 3.

3. The wafer holder of claim 1 wherein said compliant layer can withstand at least 10% shear stress without exceeding the yield strength of the said compliant layer material.

4. The wafer holder of claim 1 wherein the electrode comprises at least one conductive material selected from the group consisting of: copper, nickel, chromium, aluminum, iron, and mixtures or alloys thereof.

5. The wafer holder of claim 1 wherein said compliant layer comprises an insulative material selected from the group consisting of: fluorosilicones, polyamides, polyimides, polyketones, polyetherketones, polysulfones, polycarbonates, polystyrenes, polyurethanes, nylons, polyvinylchlorides, polypropylenes, polyethersulfones, polyethylene terephthalate, fluoroethylene propylene copolymers, cellulose, triacetates, silicones and rubbers, and combinations thereof.

6. The wafer holder of claim 1 wherein said compliant layer is between 1 and 10 μm thick.

7. An apparatus for projecting patterned charged particles onto a substrate comprising: a processing chamber; a charged particle source for generating a charged particle beam that impinges on the substrate; and an electrostatic chuck comprising an electrode and one or more layers covering a portion of a substrate holder which contacts a substrate, where at least one of the layers is compliant, so that the portion of the substrate holder which contacts the substrate deforms with the substrate avoiding relative movement between the substrate and the contacted portion of the substrate holder, when there is localized thermal deformation of the substrate during processing.

8. The apparatus of claim 7 further comprising:
a computer for calculating an estimated charged particle beam deflection to compensate for the actual deformation of the substrate caused by the exposure of the substrate to the charged particle beam, wherein the computer generates a deflection signal corresponding to the calculated deflection; and
a beam deflector for deflecting the charged particle beam in response to the deflection signal from the computer.

9. The apparatus of claim 7 wherein the compliant layer is an electrical insulator having a dielectric constant between 1 and 3.

10. The apparatus of claim 7 wherein the compliant layer can withstand at least 10% shear stress without exceeding the yield strength of the said compliant layer material.

11. The apparatus of claim 7 wherein the electrode is comprises a conductive material selected from the group consisting of: copper, nickel, chromium, aluminum, iron, and mixtures thereof.

12. The apparatus of claim 7 wherein the compliant layer comprises an insulative material selected from the group consisting of: fluorosilicones, polyamides, polyimides, polyketones, polyetherketones, polysulfones, polycarbonates, polystyrenes, polyurethanes, nylons, polyvinylchlorides, polypropylenes, polyethersulfones, polyethylene terephthalate, fluoroethylene propylene copolymers, cellulose, triacetates, silicones and rubbers, and combinations thereof.

13. The apparatus of claim 7 further comprising:
a lithography mask positioned between the charged particle source and the substrate; and
an electron sensor disposed within the processing chamber for detecting backscattered electrons emanating from the substrate.

14. The apparatus of claim 7 further comprising a substrate temperature sensor for measuring the temperature of the substrate during processing and for sending a signal corresponding to the measured substrate temperature to the computer.

15. The apparatus of claim 7 wherein the compliant layer is between 1 and 10 μm thick.

16. The apparatus of claim 7 wherein localized heating of the substrate due to exposure to the charged beam is between 1° C. and 50° C.

17. A method for patterning a photoresist layer on a substrate comprising the steps of: forming a photoresist layer on the substrate; positioning the substrate on an electrostatic chuck having one or more layers covering a portion of the substrate chuck which contacts the substrate, where at least one of the layers is compliant, so that the portion of the electrostatic chuck which contacts the substrate deforms with the substrate, avoiding relative movement between the substrate and the contacted portion of the electrostatic chuck, when there is localized thermal deformation of the substrate during processing; and exposing portions of the photoresist layer on the substrate to a charged particle beam.

18. The method of claim 17 further comprising the steps:
computing an estimated deformation of the substrate caused by exposure of the substrate to the charged particle beam; and
deflecting the particle beam in response to the estimated deformation.

19. The method of claim 17 further comprising:
using a charged particle beam to scan a first mark on a photo lithography mask onto a second mark on said substrate;
detecting backscattered electrons from said scanning step;
determining the position of the substrate using the detected backscattered electrons; and
deflecting the charged particle beam in response to the measured position of the substrate.

20. The method of claim 17 wherein the compliant layer is an insulator having a dielectric constant between 1 and 3.

21. The method of claim 17 wherein the compliant layer comprises an insulative material selected from the group consisting of: fluorosilicones, polyamides, polyimides, polyketones, polyetherketones, polysulfones, polycarbonates, polystyrenes, polyurethanes, nylons, polyvinylchlorides, polypropylenes, polyethersulfones, polyethylene terephthalate, fluoroethylene propylene copolymers, cellulose, triacetates, silicones and rubbers, and combinations thereof.

22. The method of claim 17 wherein the exposing step is performed using a SCALPEL lithography system.

23. An electrostatic chuck for use in substrate processing, the chuck having an electrode covered by an electrically insulative layer for receiving the substrate, comprising: the electrically insulative layer which is elastic, in a manner such that the portion of the electrostatic chuck which contacts the substrate deforms with the wafer, avoiding relative movement between the substrate and the contacted portion of the electrostatic chuck, when there is localized thermal deformation of the substrate during processing and can withstand at least 10% shear stress without exceeding the material yield strength.

24. The electrostatic chuck of claim 23 wherein the electrically insulative layer comprises an insulative material selected from the group consisting of: fluorosilicones, polyamides, polyimides, polyketones, polyetherketones, polysulfones, polycarbonates, polystyrenes, polyurethanes, nylons, polyvinylchlorides, polypropylenes, polyethersulfones, polyethylene terephthalate, fluoroethylene propylene copolymers, cellulose, triacetates, silicones and rubbers, and combinations thereof.

25. A method for holding a wafer on a chuck having an electrode and one or more layers covering a portion of the chuck which contacts the wafers, the method comprising the steps of: selecting the layers so that at least one of the layers covering the portion of the chuck which contacts the wafer is compliant so that the portion of the chuck which contacts the wafer deforms with the wafer, avoiding relative movement between the wafer and the contacted portion of the chuck, when there is localized thermal deformation of the wafer during processing; placing the wafer on one of the layers of the chuck, and energizing the electrode.

26. The method of claim 25 wherein the compliant layer is an electrical insulator having a dielectric constant between 1 and 3.

27. The method of claim 25 wherein the compliant layer can withstand at least 10% shear stress without exceeding a yield strength of the said compliant layer material.

28. The method of claim 25 wherein the electrode comprises at least one conductive material selected from the group consisting of: copper, nickel, chromium, aluminum, iron, and mixtures or alloys thereof.

29. The method of claim 25 wherein the compliant layer comprises an insulative material selected from the group consisting of: fluorosilicones, polyamides, polyimides, polyketones, polyetherketones, polysulfones, polycarbonates, polystyrenes, polyurethanes, nylons, polyvinylchlorides, polypropylenes, polyethersulfones, polyethylene terephthalate, fluoroethylene propylene copolymers, cellulose, triacetates, silicones and rubbers, and combinations thereof.

30. The method of claim 25 wherein the compliant layer is between 1 and 10 $\mu$m thick.

31. An apparatus for handling a substrate for use in semiconductor processing comprising: a substrate holder; and one or more layers covering a portion of the substrate holder which contacts the substrate, where at least one of the layers is compliant, so that the portion of the substrate holder which contacts the substrate deforms with the substrate, avoiding relative movement between the substrate and the contacted portion of the substrate holder, when there is localized thermal deformation of the substrate during processing.

32. The apparatus of claim 31 wherein the compliant layer can withstand at least 10% shear stress without exceeding a yield strength of the said compliant layer material.

33. The apparatus of claim 31 wherein the compliant layer comprises an insulative material selected from the group consisting of: fluorosilicones, polyamides, polyimides, polyketones, polyetherketones, polysulfones, polycarbonates, polystyrenes, polyurethanes, nylons, polyvinylchlorides, polypropylenes, polyethersulfones, polyethylene terephthalate, fluoroethylene propylene copolymers, cellulose, triacetates, silicones and rubbers, and combinations thereof.

34. The apparatus of claim 31 wherein the compliant layer is between 1 and 10 $\mu$m thick.

* * * * *